United States Patent [19]

Espenshade et al.

[11] Patent Number: 5,228,866
[45] Date of Patent: Jul. 20, 1993

[54] SOCKET FOR INTEGRATED CIRCUIT CARRIER

[75] Inventors: Leonard K. Espenshade, Harrisburg; Richard L. Marks, Mechanicsburg; Donald W. Milbrand, Mechanicsburg; Mark J. Zitto, Mechanicsburg, all of Pa.

[73] Assignee: Wells Electronics, Inc., South Bend, Ind.

[21] Appl. No.: 908,048

[22] Filed: Jul. 6, 1992

[51] Int. Cl.⁵ .................................... H01R 11/22
[52] U.S. Cl. .................................... 439/266; 439/331
[58] Field of Search .................... 439/70, 71, 72, 73, 439/264, 265, 266, 268, 330, 331, 525, 526

[56] References Cited

U.S. PATENT DOCUMENTS

| | | | |
|---|---|---|---|
| 3,982,159 | 9/1976 | Dennis et al. | 439/331 X |
| 4,931,020 | 6/1990 | Matsuoka et al. | 439/330 X |
| 4,993,955 | 2/1991 | Savant | 439/331 X |
| 5,020,998 | 6/1991 | Ikeya et al. | 439/266 |

Primary Examiner—Larry I. Schwartz
Assistant Examiner—Khiem Nguyen
Attorney, Agent, or Firm—James D. Hall

[57] ABSTRACT

A socket for securing an integrated circuit (IC) during burn-in or test procedures. The socket includes a base which carries a plurality of electrically conductive contacts. Opposed hold down latches are shiftably connected to the base and include outer cams. The socket also includes a movable top which has an integral nib for contacting the latch cams to effect shifting of the latches. A rotatable lever housed in the base is connected to an actuating arm which is shiftable by movement of the top. The lever is operably associated with the contacts and shifts the contacts between an operative position in contact with the IC leads and a standby position spaced from the leads.

8 Claims, 5 Drawing Sheets

SOCKET FOR INTEGRATED CIRCUIT CARRIER

SUMMARY OF THE INVENTION

This invention relates to sockets and will have application to burn-in or test sockets which house an integrated circuit chip.

Sockets have long been used to house integrated circuit chips during burn-in or testing operations. The socket of this invention is designed to secure a chip which is housed in an individual carrier. The socket includes a base which has a plurality of preloaded electrically conductive contacts fitted therein. A pair of rotating bar latches are connected to the base and serve to secure the carrierized chip to the socket.

The base further houses a rod which is rotatable to lower the contacts when it is desired to insert or remove the carrierized chip. The socket also includes an actuator which is movably connected to the base. The actuator, or top, includes projections which contact actuating cams to effect shifting movement of the latches between latched and unlatched positions. The top also includes projections which contact an actuating lever of the rotatable rod to effect rotation of the rod and correlative raising and lowering of the contacts.

Accordingly, it is an object of this invention to provide for a novel socket which houses an integrated circuit chip to be tested.

Another object is to provide for a socket which houses and secures a carrierized chip.

Another object is to provide for a socket which reduces or eliminates wiping of the contacts over the chip leads during inserting and removal.

Another object is to provide for a socket of reliable construction and which is efficient and economical.

Other objects will become apparent upon a reading of the following description.

BRIEF DESCRIPTION OF THE DRAWINGS

A preferred embodiment of the invention has been depicted for illustrative purposes wherein.

DESCRIPTION OF THE PREFERRED EMBODIMENT

The preferred embodiment herein described is not intended to be exhaustive or to limit the invention to the precise form disclosed. It is chosen and described to illustrate the principles of the invention and its application and practical use to enable others skilled in the art to utilize its teachings.

Figure 1:
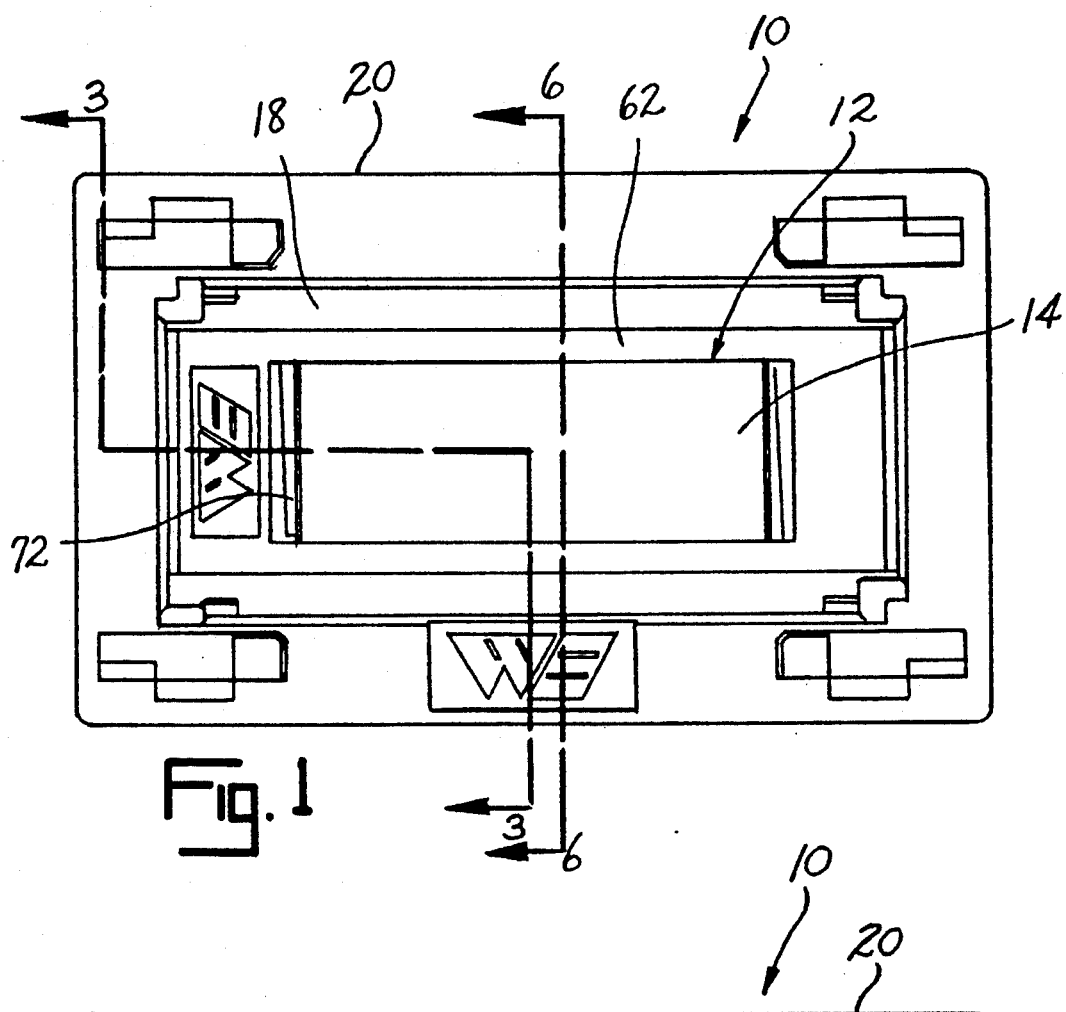
FIG. 1 is a top plan view of the socket of this invention.
Figure 2:
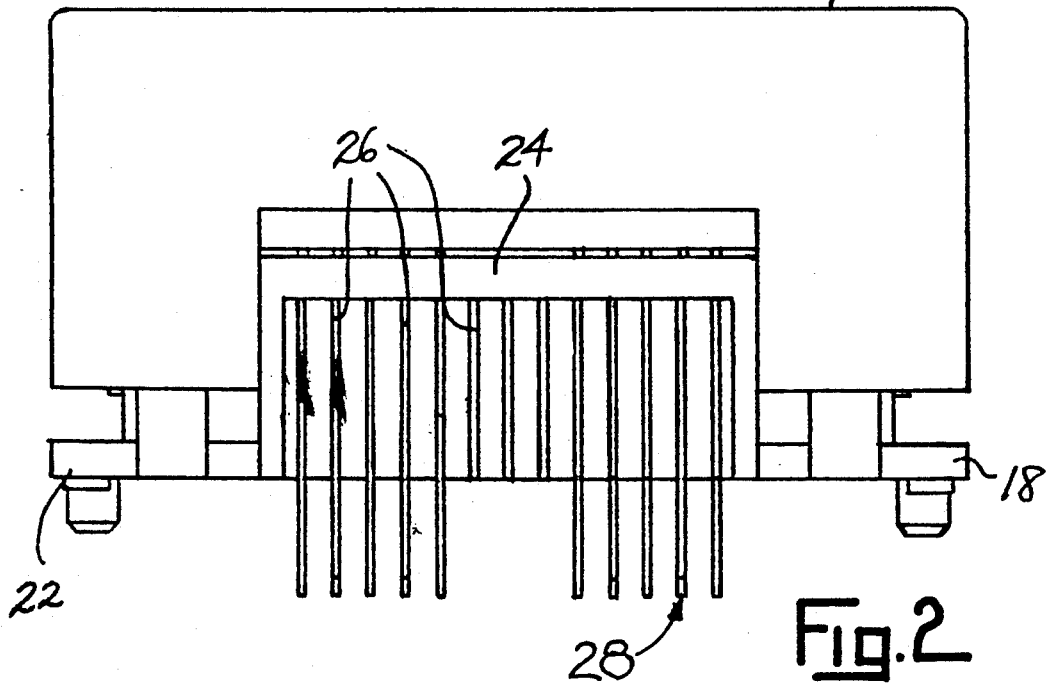
FIG. 2 is a side elevation view of the socket.

Referring first to FIG. 1, reference numeral 10 generally designates the socket of this invention. Socket 10 is used to house an integrated circuit chip 12 which has a body 14 and a plurality of leads 16 which extend outwardly of the body. In the embodiment shown, chip 12 has a generally rectangular body 14 and approximately twenty leads 16 which extend from opposite sides of the body, but socket 10 may be modified to accommodate other sizes, shapes and lead configurations of chip 12.

Socket 10 includes a non-conductive base 18 and a movable non-conductive actuator or top 20 which is shiftably connected to the base. Base 18 is preferably of a one piece molded construction and includes peripheral end located rims 22 and an upraised table 24. A plurality of grooves 26 are defined in table 24. Grooves 26 are shown oriented in a transverse orientation from side-to-side but their orientation is a matter of design dictated by the configuration of chip 12. In the embodiment shown, there are twenty-six grooves 26 defined in table 24, thirteen on either side of the table.

A plurality of electrically conductive contacts 28 are housed in grooves 26, one contact to each groove. Each contact 28, as shown in FIGS. 3-6 is of one-piece construction and includes a generally L-shaped base defined by lower legs 30 and upright stem 32. Feet 34 extend from leg 30 down beneath the lowermost edge of base 18 and provide for connection to a test or burn-in board (not shown). Each contact leg 30 includes a terminal lip 31 and each stem 32 includes terminal lip 33 which allows each contact 28 to be firmly secured to base 18.

Each contact 28 also includes a curved neck 36 which terminates in an uppermost head 38 and a downturned platform 40. Head 38 extends upwardly of table 24 and contacts the corresponding lead 16 of chip 12 to provide and maintain electrical continuity therebetween. Platform 40 as shown is general L-shaped and interrupts a bore 42 defined in the longitudinal axis of table 24.

An actuator rod 46 is rotatably housed in bore 42. Rod 46 is generally of the cross-sectional configuration shown and terminates in an exposed actuating lever 48 located at an end of table 24. For design purposes, two bores 42 and rods 46 are provided for in the embodiment shown, one along each side of table 24 to ensure simultaneous action of the rods.

A latch bar 50 is shiftably connected to each end of table 24. Each latch bar 50 includes an elongated curved latch 52 and integral depending cam actuators 54. Actuator 54 is secured to base 18 at one end by projection 56 with rod 46 extending through the other actuator. Each latch bar 50 is rotatable between latched and unlatched positions as shown in the drawings.

Each cam actuator 54 has an outer camming surface 58 and a lower nib 60. Surface 58 rides along an inner projecting surface of socket top 20 to allow for correlative movement of the top and the cam actuators with their corresponding latch bars 50.

Base 18 also includes integral posts (not shown) located at each corner of the base. Each post includes an upper hook part (not shown) which mates with a shoulder (not shown) of top 20 and serves to limit upward travel of the top and to secure the top of the base. This feature is shown in U.S. Pat. No. 4,623,208 and does not constitute a part of this invention.

Chip 12 is preferably secured for testing to a carrier generally designated by reference numeral 62. Carrier 62 as shown includes a generally rectangular frame 64 defining a central opening 66. Frame 64 defines stepped shoulders 68, 70 and integral latch arms 72 (FIG. 1) which secure chip 12 to the carrier 62 in a snap-fit fashion. When secured, chip body 14 abuts against shoulder 68 and chip leads 16 abut against shoulder 70.

Top 20 includes a generally rectangular frame 74 which defines central opening 76. Top 20 is movably secured to base 18 as by the above described hook-shoulder combination (not shown). The inner wall surface 78 of frame 74 defines a lower shoulder 80 and angled projection 82. The lower surface 84 of projection 82 contacts camming surface 58 of each cam actuator 54, 55 as shown. Projection 82 also defines an angled upper surface 85 which acts as a guide for camming surface 58 as top 20 is depressed.

Top 20 also includes an interior end located projection 86 at each inner end surface 88. Projection 86 communicates with actuating lever 48 to depress the lever as the top 20 is depressed.

Socket 10 functions to serve a chip 12 for testing or burn-in as shown in FIGS. 3-6. The description below will sequentially describe the process of removing the chip 12 form socket 10, and the insertion of another chip 12. In the case described, chip 12 is housed in carrier 62.

Figure 3:
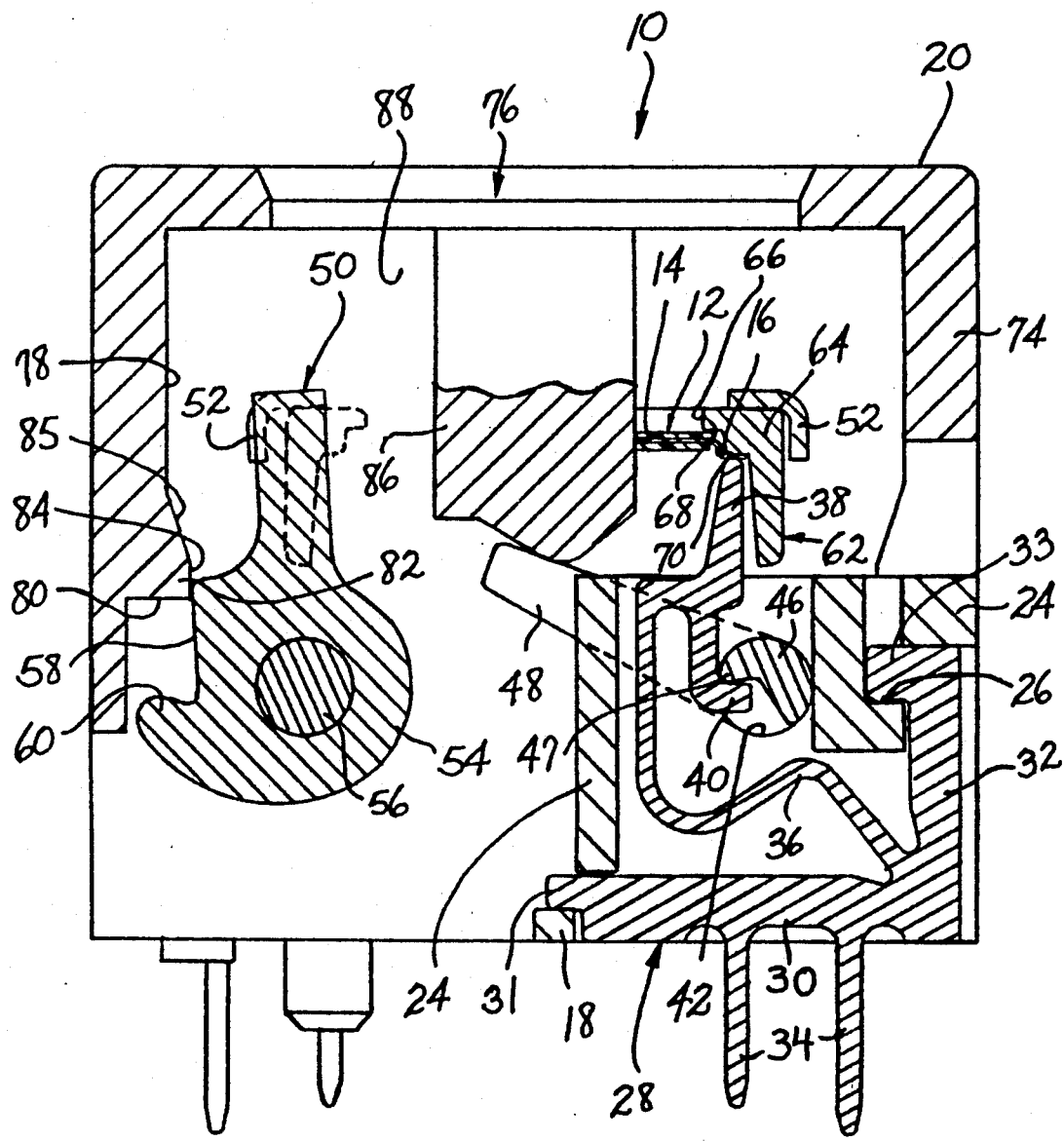
FIG. 3 is a sectional view taken along line 3—3 of FIG. 1 with the top shown in a raised position.

FIG. 3 illustrates socket 10 with top 20 in a full up position, with carrier 62 secured therein by latch bars 50. The top 20 is normally kept in this position by the preloaded nature of contacts 28. In this position, latches 52 overlie carrier frame 64 and contact heads 38 bear against chip leads 16 to both firmly secure chip 12 in socket 10 and to provide electrical connection through contact legs 30 to a testing or burn-in board (not shown).

Figure 4:
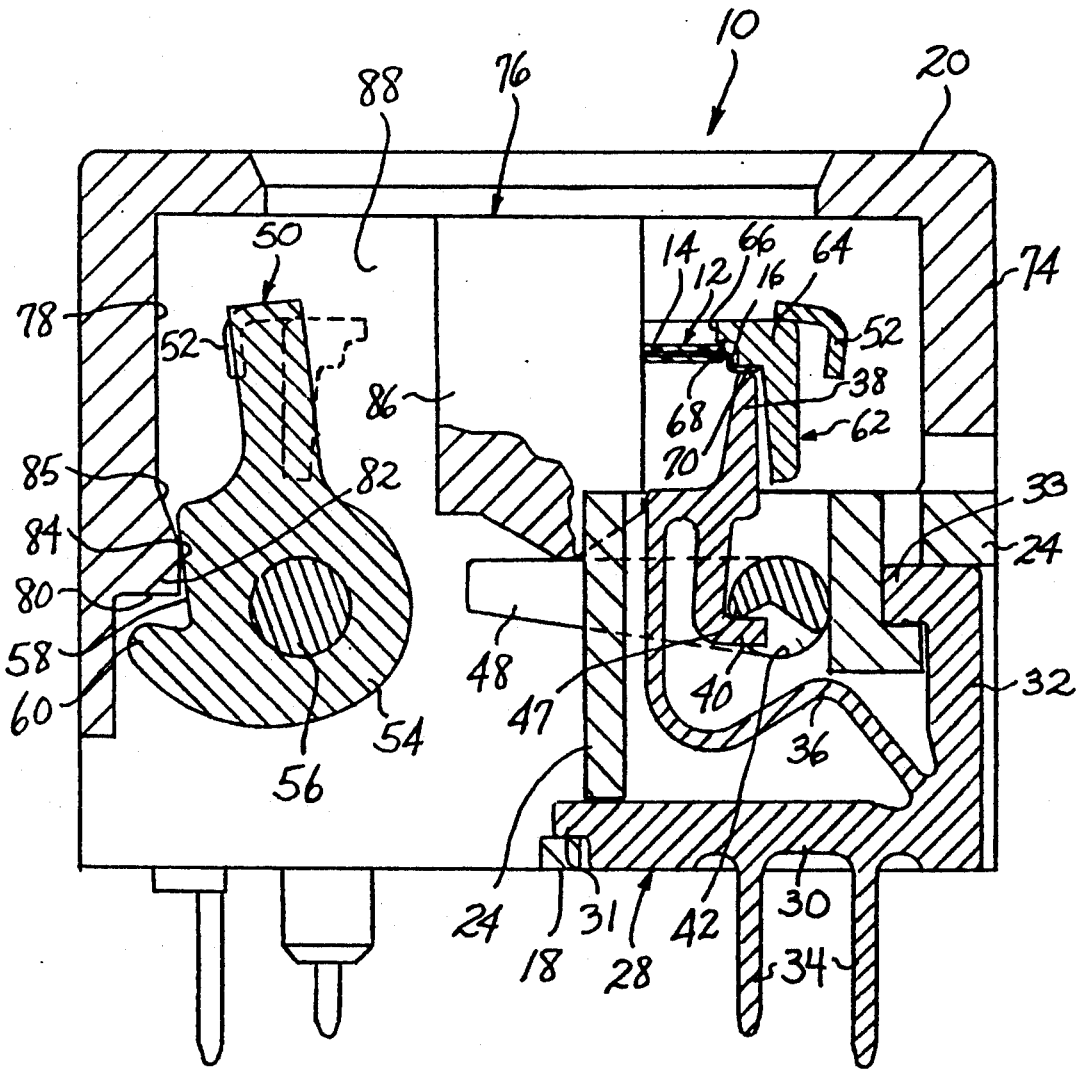
FIG. 4 is a sectional view similar to FIG. 3 showing the top in a partially depressed position.
Figure 5:
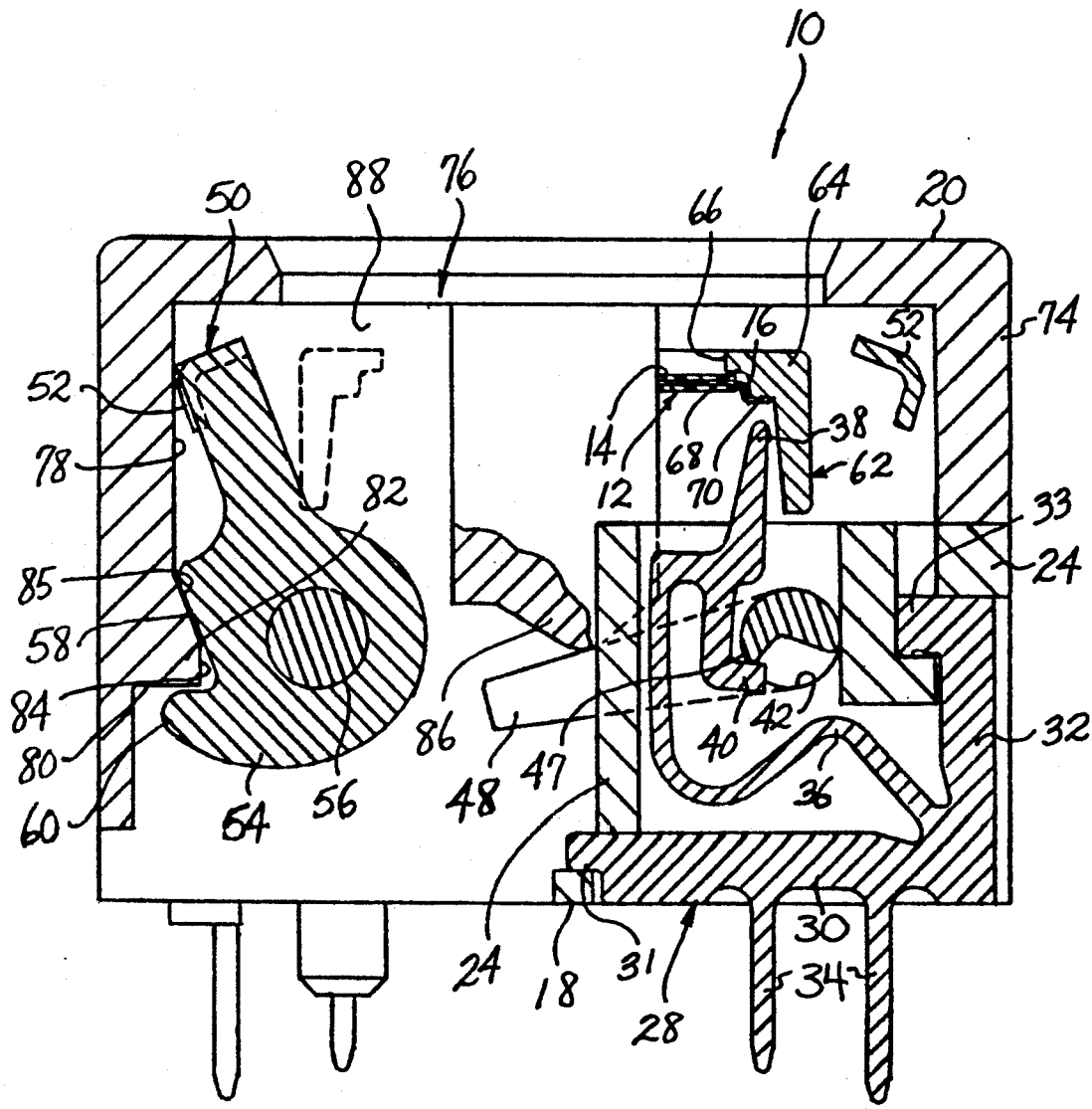
FIG. 5 is a sectional view similar to FIG. 4 showing the top in a fully depressed position.
Figure 6:
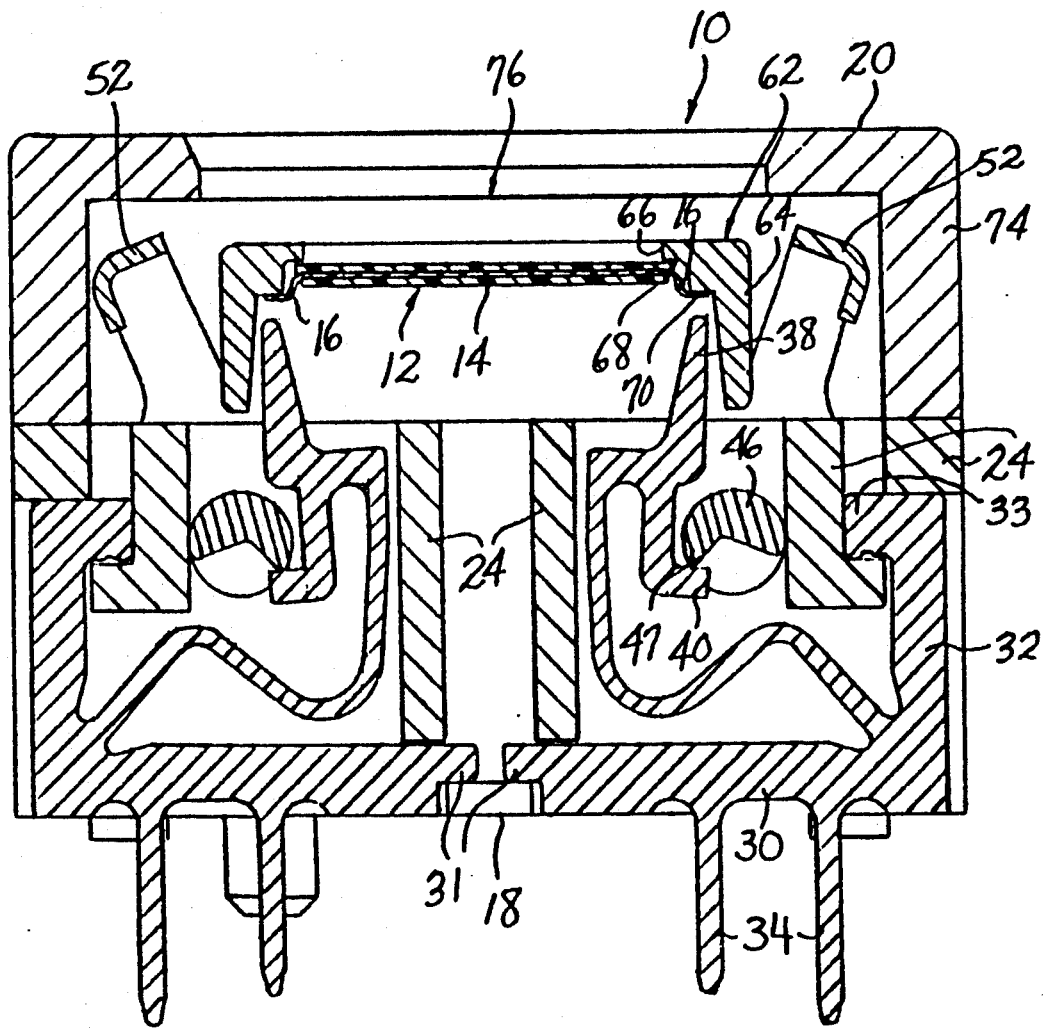
FIG. 6 is a sectional view taken along line 6—6 of FIG. 1.

FIGS. 4-6 illustrate the action of the top 20 when depressed. To remove carrier 62 and chip 12 from socket 10, top 20 is depressed (either manually or by a machine) towards base 18. As top 20 is depressed, two things happen.

First, shoulder 80 pushes against nib 60 to pivot the actuators 54 towards the side surfaces 78 of top 20. Since actuators 54 are integrally connected with latches 52, this causes the latches to shift outwardly as well. As the top 20 continues on to its fully depressed position (FIG. 5) shoulder 80 pushes on nib 60 to urge the camming actuators 54, 55 and latches 52 to the full open position spaced from carrier 62. The chip 12 and carrier 62 are then removed (again this may be accomplished manually or by machine).

Second, depression of the top 20 causes its integral end projections 86 to push on actuating levers 48. As the top continues its downward movement, levers 48 and their connected actuator rods 46 rotate counter-clockwise as shown in FIGS. 4-6. Each actuator rod 46 is preferably configured as shown in the drawings to define a force applicator portion 47 which bears against platform 40 of each contact 28.

As top 20 is depressed and rods 46 rotate as shown, portion 47 pushes down on platform 40 in cantilevered fashion to urge the head 38 of each contact 28 downwardly away from chip leads 16. When top 20 is depressed fully (FIG. 6), contact head 38 is spaced from chip leads 16 to break electrical connection between the chip 12 and the test board (not shown).

After chip 12 and carrier 62 are removed from socket 10, a new chip and carrier may be inserted through top opening 76 with zero insertion force. Top 20 is then released. The preloaded nature of resilient contacts 28 causes platform 40 to bear against rod portion 47 to rotate rods 46 in a clockwise direction until contact head 38 contacts chip leads 16 to establish electrical connection. As rods 46 rotate, layer 48 pushes against top projection 86 to urge top 20 back into its full normally up position (FIG. 3).

As top 20 is raised, camming surface 84 bears against surface 58 of actuators 54 to pivot the latches 52 back into their latched position overlying carrier 62 (FIG. 3).

It is understood that the above description does not limit the invention to the precise form disclosed but may be modified within the scope of the following claims.

What is claimed is:

1. A socket for housing an integrated circuit, said integrated circuit including a body and a plurality of leads extending outwardly of said body, said socket comprising a base, a plurality of electrically conductive contacts housed in said base, latch means shiftably connected to said base for securing said integrated circuit to said socket, actuator means movably connected to said base for shifting said latch means between a normally latched position overlying said circuit body wherein the integrated circuit may be removed, said actuator means further including means for shifting said contacts between a first position contacting said circuit leads with the latch means in said latched position and a second position spaced from the leads with the latch means in the unlatched position, said latch means including an integral outwardly projecting terminal cam part, said actuator means including an integral inner projection contacting said cam part to shift said latch means as said actuator means is moved relative to the base.

2. The socket of claim 1 wherein each contact includes an upper cantilevered beam, said means for shifting includes a rod rotatably housed in said base and having an edge operatively associated with said beam, and an actuator lever connected to said rod, said actuator means including a protrusion contacting said actuator lever as the actuator means is moved toward said base.

3. The socket of claim 1 wherein said integrated circuit is housed in a carrier, said latch means overlying and securing said carrier when in the latched position.

4. The socket of claim 1 and including means connected to said base for movably securing the actuator means to the base.

5. The socket of claim 1 wherein said circuit body is housed in a carrier, said latch means includes first and second latch bars, each latch bar overlying and abutting against said chip carrier when the latch means is in said latched position.

6. A socket for housing an integrated circuit, said integrated circuit including a body, and a plurality of leads, said socket comprising a base, a plurality of electrically conductive contacts housed in said base, latch means shiftably connected to said base for securing said integrated circuit to said socket, actuator means movably connected to said base for shifting said latch means between a normally latched position overlying said circuit body in an unlatched position spaced from said circuit body wherein the integrated circuit may be removed, each contact including a cantilevered beam, said actuator means further including means for shifting said contacts between a first position contacting said circuit leads and a second position spaced from the leads, said means for shifting including a rod rotatably housed in said base and having an edge operatively associated with each beam, and an actuator lever connected to said rod, said actuator means including a protrusion contacting said actuator lever as the actuator means is moved towards said base.

7. The socket of claim 6 wherein said latch means includes an integral terminal cam part, said actuator means including an integral projection contacting said cam part as said actuator means is moved towards the base.

8. The socket of claim 6 wherein said rod is rotatably housed in said base, said protrusion coacting with said actuator lever to rotate said rod into and out of contact with said cantilevered beam.

* * * * *